(12) United States Patent
Uno et al.

(10) Patent No.: US 9,159,607 B2
(45) Date of Patent: Oct. 13, 2015

(54) SEMICONDUCTOR DEVICE AND METHOD OF MANUFACTURING SEMICONDUCTOR DEVICE

(71) Applicant: RENESAS ELECTRONICS CORPORATION, Kanagawa (JP)

(72) Inventors: Satoshi Uno, Kanagawa (JP); Hideaki Tsuchiya, Kanagawa (JP); Shinji Yokogawa, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 185 days.

(21) Appl. No.: 13/781,496

(22) Filed: Feb. 28, 2013

(65) Prior Publication Data

US 2013/0221520 A1 Aug. 29, 2013

(30) Foreign Application Priority Data

Feb. 29, 2012 (JP) .................................. 2012-042806
Oct. 9, 2012 (JP) .................................. 2012-223966

(51) Int. Cl.
*H01L 21/00* (2006.01)
*H01L 21/768* (2006.01)
(Continued)

(52) U.S. Cl.
CPC .... *H01L 21/76841* (2013.01); *H01L 23/49811* (2013.01); *H01L 24/11* (2013.01); *H01L 24/13* (2013.01); *H01L 24/16* (2013.01); *H01L 24/81* (2013.01); *H01L 24/05* (2013.01); *H01L 2224/0401* (2013.01); *H01L 2224/05022* (2013.01); *H01L 2224/05099* (2013.01); *H01L 2224/05186* (2013.01); *H01L 2224/05572* (2013.01); *H01L 2224/05582* (2013.01); *H01L 2224/05647* (2013.01); *H01L 2224/1146* (2013.01); *H01L 2224/1147* (2013.01); *H01L 2224/11472* (2013.01); *H01L 2224/13017* (2013.01); *H01L 2224/13022* (2013.01); *H01L 2224/13083* (2013.01); *H01L 2224/13111* (2013.01); *H01L 2224/13147* (2013.01);
(Continued)

(58) Field of Classification Search
CPC ................... H01L 21/76841; H01L 23/49811; H01L 24/11; H01L 24/16; H01L 24/81; H01L 24/13; H01L 2924/00014; H01L 2924/13091; H01L 2224/16225; H01L 2924/00013
See application file for complete search history.

(56) References Cited

U.S. PATENT DOCUMENTS 8,664,760 B2 * 3/2014 Yu et al. ........................ 257/737

OTHER PUBLICATIONS

Wu, W.H. et al. "The Influence of Current Direction on the Cu—Ni Cross-Interaction in Cu/Sn/Ni Diffusion Couples." Journal of Electronic Materials. vol. 38. No. 12. Jul. 7, 2009.
(Continued)

*Primary Examiner* — Laura Menz
(74) *Attorney, Agent, or Firm* — McDermott Will & Emery LLP

(57) ABSTRACT

A semiconductor chip SC includes an electrode pad PAD. A Cu pillar PIL is formed on the electrode pad PAD. In addition, an interconnect substrate INT includes a connection terminal TER. The connection terminal TER contains Cu. For example, the connection terminal TER is formed of Cu, and is formed, for example, in a land shape. However, the connection terminal TER may not be formed in a land shape. The Cu pillar PIL and the connection terminal TER are connected to each other through a solder layer SOL. The solder layer SOL contains Sn. A Ni layer NIL is formed on either the Cu pillar PIL or the connection terminal TER. The minimum value L of the thickness of the solder layer SOL is equal to or less than 20 μm.

7 Claims, 18 Drawing Sheets

(51) Int. Cl.
*H01L 23/498* (2006.01)
*H01L 23/00* (2006.01)

(52) U.S. Cl.
CPC .......... *H01L2224/13155* (2013.01); *H01L 2224/14133* (2013.01); *H01L 2224/14135* (2013.01); *H01L 2224/14136* (2013.01); *H01L 2224/14177* (2013.01); *H01L 2224/16225* (2013.01); *H01L 2224/16227* (2013.01); *H01L 2224/16238* (2013.01); *H01L 2224/814* (2013.01); *H01L 2224/81191* (2013.01); *H01L 2224/81385* (2013.01); *H01L 2224/81447* (2013.01); *H01L 2224/81801* (2013.01); *H01L 2224/94* (2013.01); *H01L 2924/00013* (2013.01); *H01L 2924/00014* (2013.01); *H01L 2924/13091* (2013.01); *H01L 2924/3656* (2013.01)

(56) References Cited

OTHER PUBLICATIONS

Wu, W.H. et al. "The Influence of Current Direction on the Cu—Ni Cross-section in Cu/Sn/Ni Diffusion Couples." Journal of Electronic Materials. vol. 38. No. 12. Jul. 7, 2009.

* cited by examiner

FIG. 2A
FIG. 2B
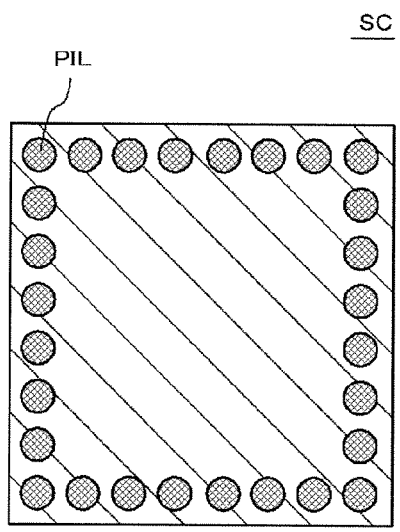
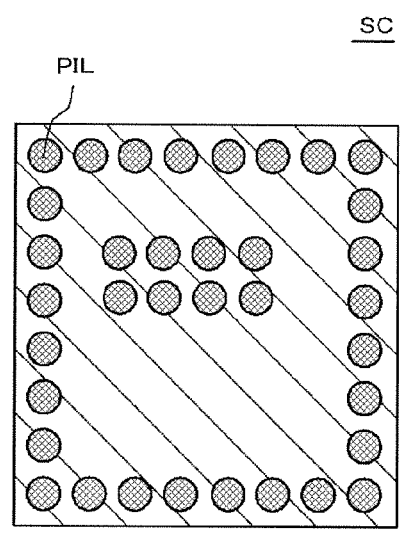

FIG. 3A
FIG. 3B
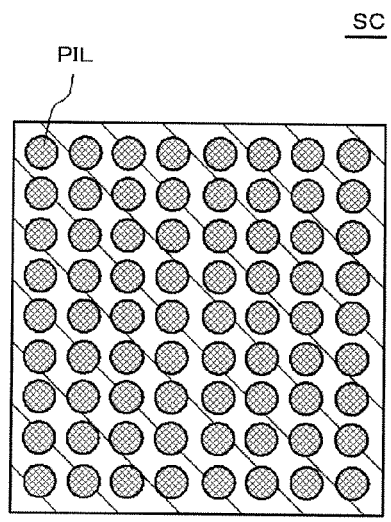
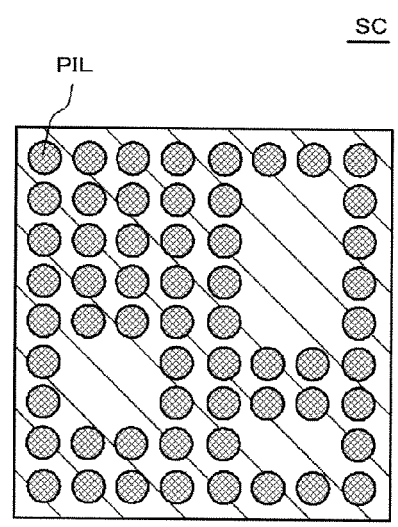

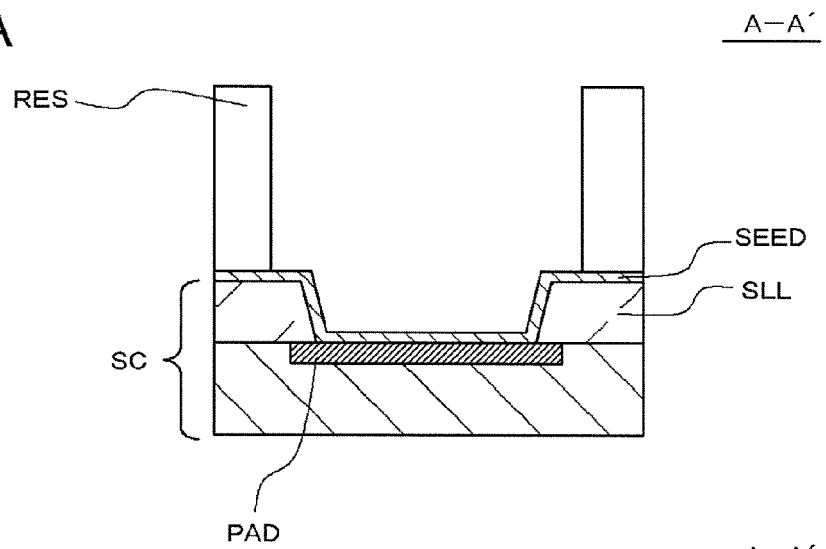
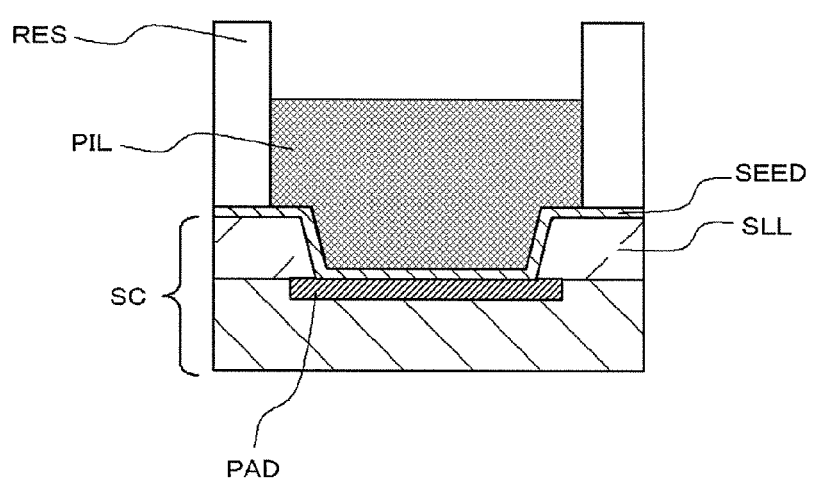

FIG. 8A
FIG. 8B
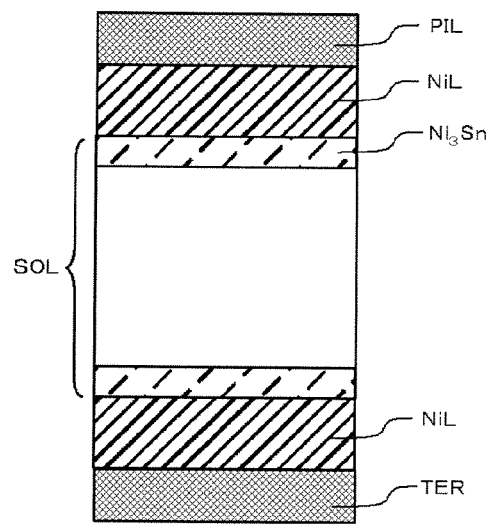
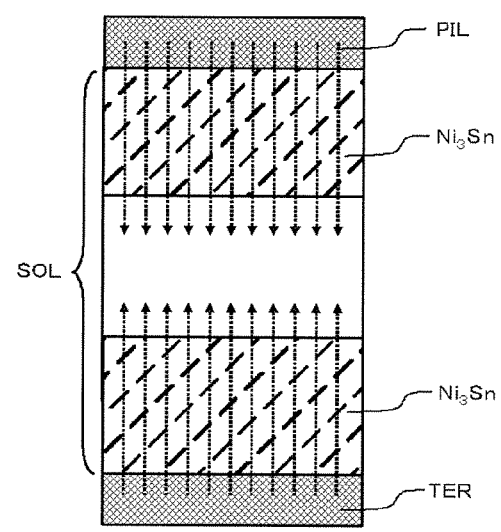

SEMICONDUCTOR DEVICE AND METHOD OF MANUFACTURING SEMICONDUCTOR DEVICE

This application is based on Japanese patent application Nos. 2012-042806 and 2012-223966, the contents of which are incorporated herein by reference.

BACKGROUND

1. Technical Field

The present invention relates to a semiconductor device and a method of manufacturing a semiconductor device, and relates to, for example, a semiconductor device in which a semiconductor chip is connected to an interconnect substrate in a flip-chip manner and a method of manufacturing a semiconductor device.

2. Related Art

There is flip-chip connection in one of the mounting types of a semiconductor chip. The flip-chip connection is a type in which an active surface of a semiconductor chip is caused to face an interconnect substrate, and then an electrode pad of the semiconductor chip and a terminal of the interconnect substrate are connected to each other through a solder. In recent years, in order to cope with the miniaturization of an electrode pad, a structure has been developed in which a Cu pillar is formed on the electrode pad, and the Cu pillar and the electrode pad are connected to each other by a solder. Here, as a solder, a Sn-based solder in which Pb is not used has been employed.

On the other hand, W. H. WU, and Three Others, "The influence of Current Direction on the Cu—Ni Cross-Interaction in Cu/Sn/Ni Diffusion Couples", Journal of ELECTRONIC MATERIALS, Vol. 38, NO. 12, 2009 shows a result of examining electromigration when Sn is disposed between Cu and Ni. In this document, it is known that the distance between Cu and Ni is approximately 60 to 80 μm when seen from a photograph. In this condition, the formation of a void in Sn due to electromigration is reported.

When the Cu pillar is provided on the electrode pad, Cu diffuses from the Cu pillar to the Sn-based solder due to electromigration. When Cu diffuses to the Sn-based solder, an alloy Cu and Sn is formed, which leads to the formation of a void in the solder. When a void is formed in a solder, there is a high possibility of the solder being severed. Other problems and new features will be obvious from the description and the accompanying drawings of the present specification.

SUMMARY

In one embodiment, there is provided a semiconductor chip including an electrode pad. A Cu pillar is formed on the electrode pad. In addition, a connection terminal of an interconnect substrate is formed of a metal containing Cu. The Cu pillar and the connection terminal are connected to each other through a solder layer containing Sn. The Ni layer is formed either between the Cu pillar and the solder layer or between the solder layer and the connection terminal. The distance between the upper surface of the Cu pillar and the connection terminal is equal to or less than 20 μm.

According to the embodiment, it is possible to prevent the solder for connecting the Cu pillar to the connection terminal of the interconnect substrate from being severed.

BRIEF DESCRIPTION OF THE DRAWINGS

The above and other objects, advantages and features of the present invention will be more apparent from the following description of certain preferred embodiments taken in conjunction with the accompanying drawings, in which:

FIGS. 2A and 2B are plan views illustrating a semiconductor chip.

FIGS. 3A and 3B are plan views illustrating the semiconductor chip.

FIGS. 5A and 5B are diagrams illustrating a method of manufacturing a semiconductor device shown in FIG. 4.

FIGS. 8A and 8B are diagrams illustrating a change in a structure of a solder layer when a Ni layer is provided on both a Cu pillar and a connection terminal.

DETAILED DESCRIPTION

Figure 1:
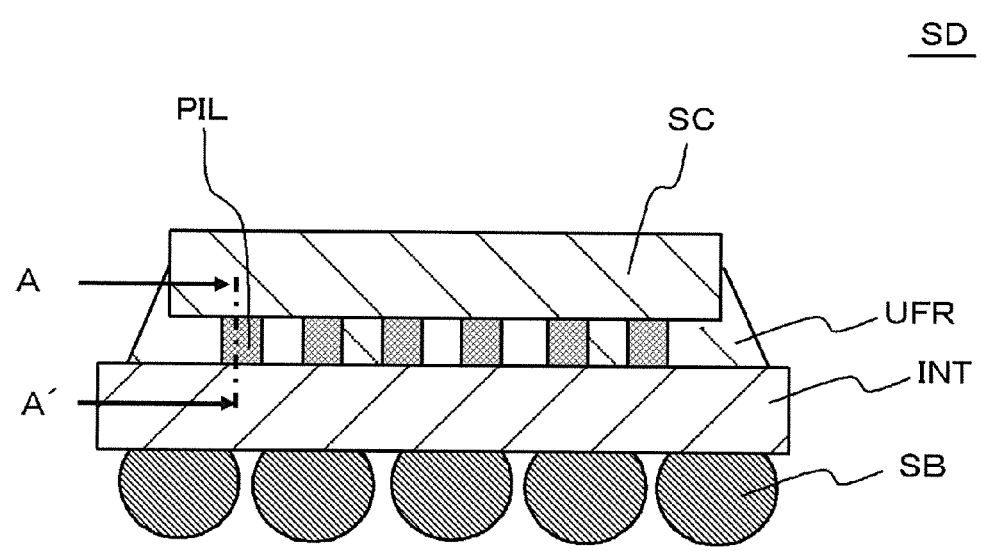
FIG. 1 is a cross-sectional view illustrating a configuration of a semiconductor device.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, embodiments of the invention will be described with reference to the accompanying drawings. In all the drawings, like elements are referenced by like reference numerals and signs, and descriptions thereof will not be repeated.

First Embodiment

FIG. 1 is a cross-sectional view illustrating a configuration of a semiconductor device SD according to a first embodiment. The semiconductor device SD includes a semiconductor chip SC and an interconnect substrate INT. The semiconductor chip SC is, for example, a chip in which logic circuits and memory circuits are consolidated, but may include only the logic circuits, and may include only the memory circuits. In addition, the semiconductor chip SC may include a CoC (Chip on Chip) structure in which a plurality of semiconductor chips are laminated or a SIP (System In Package) structure.

The semiconductor chip SC is mounted in a flip-chip on the interconnect substrate INT. The semiconductor chip SC includes Cu pillars PIL, and is connected to the interconnect substrate INT through the Cu pillars PIL. The connection portion of the semiconductor chip SC and the interconnect substrate INT is sealed by an underfill resin UFR. The interconnect substrate INT includes solder balls SB on the surface on the opposite side to the surface on which the semiconductor chip SC is mounted. The solder balls SB are connected to an internal circuit of the semiconductor chip SC through interconnects and the Cu pillars PIL within the interconnect substrate INT.

FIGS. 2A and 2B are plan views illustrating the semiconductor chip SC, and show a first example of a layout of the Cu pillars PIL. In the example shown in the drawings, the Cu pillars PIL are disposed along the edge of the semiconductor chip SC. Specifically, in the example shown in FIG. 2A, the Cu pillars PIL are disposed in only a region along the edge of the semiconductor chip SC. On the other hand, in the example shown in FIG. 2B, the Cu pillars PIL are disposed even in a portion of the inner side, in addition to the region along the edge of the semiconductor chip SC.

FIGS. 3A and 3B are plan views illustrating the semiconductor chip SC, and show a second example of a layout of the Cu pillars PIL. In the example shown in the drawings, the Cu pillars PIL are disposed in a matrix on the entire surface of the semiconductor chip SC. Specifically, in the example shown in FIG. 3A, the Cu pillars PIL are disposed on the entire surface of the semiconductor chip SC. On the other hand, in the example shown in FIG. 3B, the Cu pillars PIL are not disposed on a portion of the semiconductor chip SC. Meanwhile, in the examples shown in FIGS. 3A and 3B, the Cu pillars PIL are uniformly disposed. However, the arrangement interval of the Cu pillars PIL on a portion of the region may be different from the arrangement interval of the Cu pillars PIL on the other regions.

Figure 4:
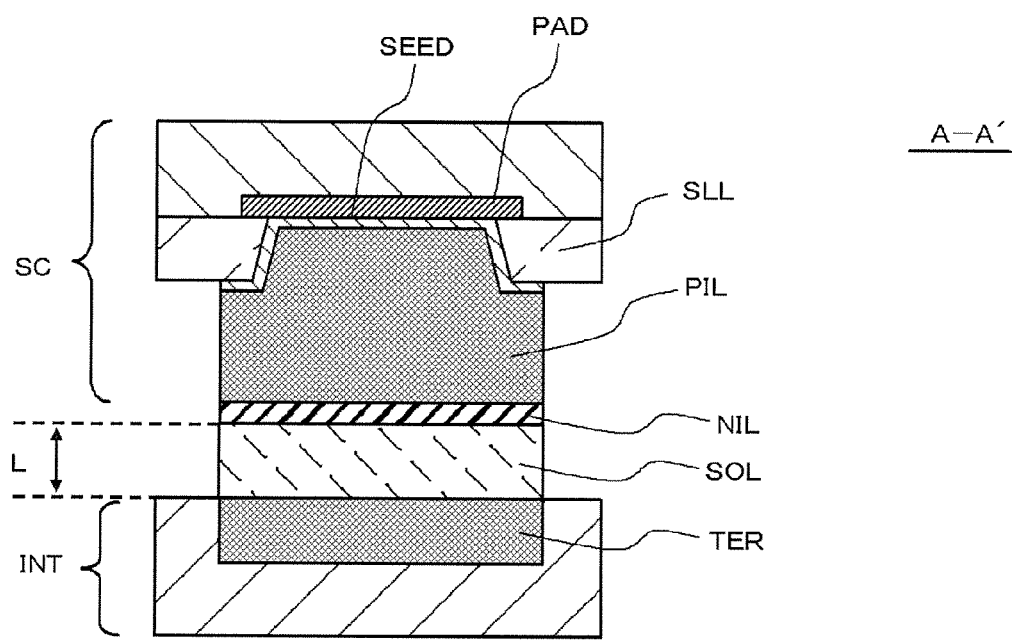
FIG. 4 is an enlarged view of section A-A' of FIG. 1.

FIG. 4 is an enlarged view of section A-A' of FIG. 1. The semiconductor chip SC includes an electrode pad PAD. The Cu pillar PIL is formed on the electrode pad PAD. In addition, the interconnect substrate INT includes a connection terminal TER. The connection terminal TER contains Cu. For example, the connection terminal TER is formed of Cu, and is formed, for example, in a land shape. However, the connection terminal TER may not be formed in a land shape. The Cu pillar PIL and the connection terminal TER are connected to each other through a solder layer SOL. The solder layer SOL contains Sn. A Ni layer NIL is formed on either between the Cu pillar PIL and the connection terminal TER. The minimum value L of the thickness of the solder layer SOL is equal to or less than 20 μm.

Specifically, the semiconductor chip SC includes a multilevel interconnect layer. The electrode pad PAD is formed in an uppermost layer of the multilevel interconnect layer. A protective insulating film (passivation film) is formed in the uppermost layer of the multilevel interconnect layer. The protective insulating film includes at least one of a silicon oxide film, a silicon nitride film, and a silicon oxynitride film. An opening for exposing the electrode pad PAD is formed in the protective insulating film. A polyimide layer SLL is formed on the protective insulating film. The polyimide layer SLL includes an opening on the electrode pad PAD. A laminated film SEED of a barrier layer and a seed layer in this order are formed within the opening and on the electrode pad PAD. The barrier layer is a layer for preventing Cu from diffusing the electrode pad PAD and the protective insulating film, and is formed of, for example, TiN. The seed layer is a seed layer for causing the Cu pillar PIL to grow by plating, and is formed of, for example, Cu.

The Cu pillar PIL is formed by a plating method as mentioned above. The upper surface of the Cu pillar PIL may be approximately flat in shape, and at least one of a concave portion and a convex portion may be formed thereon.

In the embodiment, the Ni layer NIL is formed on the Cu pillar PIL. The Ni layer NIL is formed of by a plating method, and the content of Ni is equal to or more than 99 wt %. The thickness of the Ni layer NIL is, for example, equal to or more than 0.1 μm and equal to or less than 10 μm.

The solder layer SOL contains Sn, and does not contain Pb. The content of Sn in the solder layer SOL is, for example, equal to or more than 90 wt %, and preferably equal to or more than 95%. The solder layer SOL is formed of, for example, SnAg. Both the upper surface of the Cu pillar PIL and the upper surface of the connection terminal TER often include irregularities. For this reason, the thickness of the solder layer SOL does not often become uniform. The minimum value L of the thickness of the solder layer SOL is equal to or less than 20 μm, preferably equal to or less than 15 μm, and more preferably equal to or less than 11 μm. Meanwhile, the minimum value L is preferably equal to or more than 5 μm.

FIG. 5A to FIG. 7 are cross-sectional views illustrating an example of a method of manufacturing the semiconductor device SD. First, an element isolation film is formed on a semiconductor wafer. Thereby, an element formation region is isolated. The element isolation film is formed using, for example, an STI method, but may be formed using a LOCOS method. Next, a gate insulating film and a gate electrode are formed on the semiconductor wafer located in the element formation region. The gate insulating film may be a silicon oxide film, and may be a high dielectric constant film (for example, hafnium silicate film) of which the dielectric constant is higher than that of the silicon oxide film. When the gate insulating film is a silicon oxide film, the gate electrode is formed by a polysilicon film. In addition, when the gate insulating film is a high dielectric constant film, the gate electrode is formed by a laminated film of a metal film (for example, TiN) and a polysilicon film. In addition, when the gate electrode is formed of polysilicon, a polysilicon resistance may be formed on the element isolation film in a process of forming the gate electrode.

Next, an extension region of a source and a drain is formed on the semiconductor wafer located in the element formation region. Next, a sidewall is formed on the sidewall of the gate electrode. Next, an impurity region serving as a source and a drain is formed on the semiconductor wafer located in the element formation region. In this manner, a MOS transistor is formed on the semiconductor wafer.

Next, a multilevel interconnect layer is formed on the element isolation film and the MOS transistor. An electrode pad PAD is formed in the uppermost interconnect layer. Next, a protective insulating film (passivation film) is formed on the multilevel interconnect layer. An opening located on the electrode pad PAD is formed in the protective insulating film.

Next, as shown in FIG. 5A, a polyimide layer SLL is formed on the protective insulating film and an electrode pad PAD. Next, an opening located on the electrode pad PAD is formed in a polyimide layer SLL by exposing and developing the polyimide layer SLL. Next, a laminated film SEED of a barrier layer and a seed layer is formed on the polyimide layer SLL and within an opening, for example, by a sputtering method. A portion of the barrier layer is connected to the electrode pad PAD.

Next, a resist film RES is formed on the laminated film SEED, and the resist film RES is exposed and developed. Thereby, on opening is formed in the resist film RES. This opening is located in a region for causing the Cu pillar PIL to grow, and specifically, is formed so as to include the electrode pad PAD on the inner side when seen in a plan view.

Next, as shown in FIG. 5B, Cu is caused to grow by plating on the portion which is exposed to within the opening of the resist film RES on the laminated film SEED. Thereby, the Cu pillar PIL is formed.

Figure 6A:
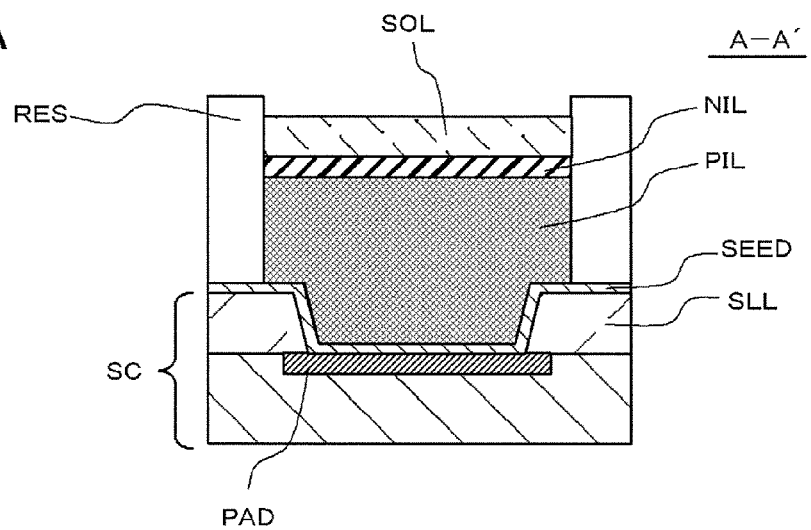
FIGS. 6A and 6B are diagrams illustrating a method of manufacturing the semiconductor device shown in FIG. 4.

Next, as shown in FIG. 6A, using the resist film RES as a mask, a Ni layer NIL and a solder layer SOL are caused to grow by plating, in this order, on the Cu pillar PIL.

Figure 6B:
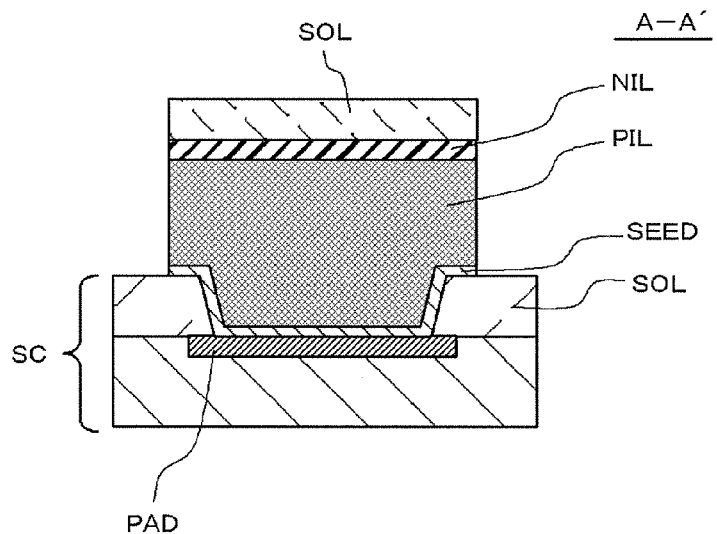

Next, as shown in FIG. 6B, the resist film RES is removed, and the portion in which the Cu pillar PIL is not formed of the laminated film SEED is further removed.

Thereafter, the semiconductor chip SC is cut out by dicing the semiconductor wafer.

Figure 7:
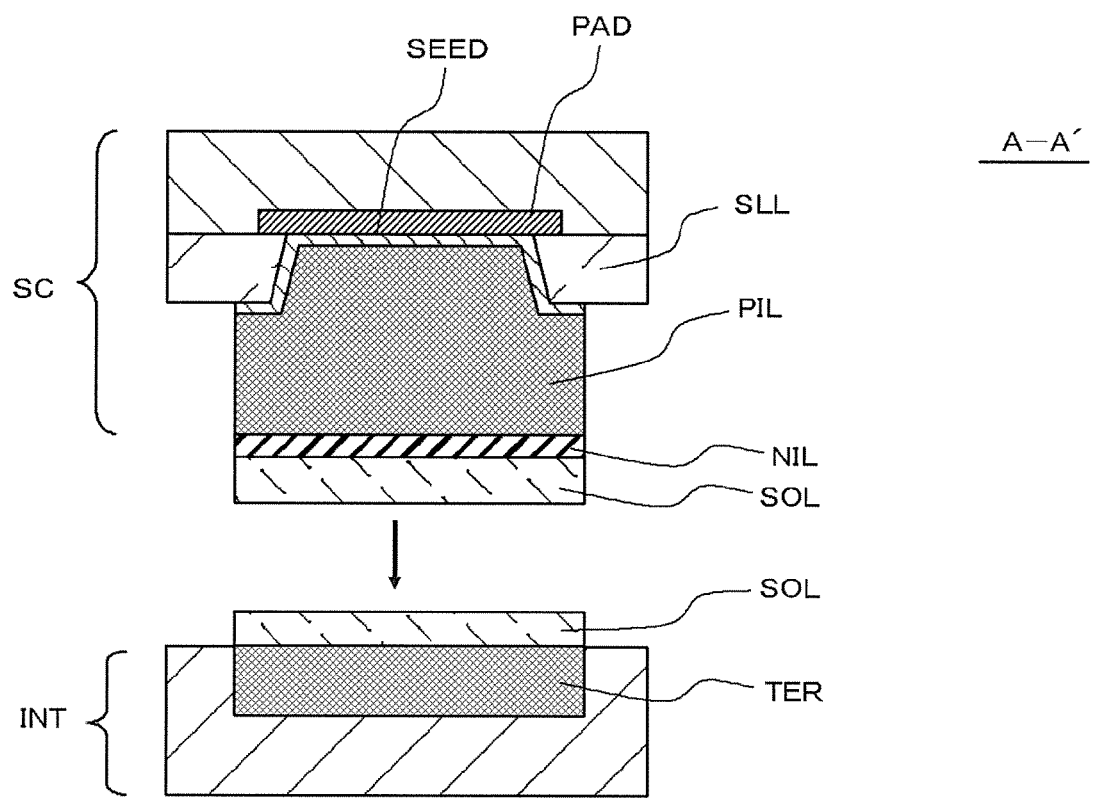
FIG. 7 is a diagram illustrating a method of manufacturing the semiconductor device shown in FIG. 4.

In addition, as shown in FIG. 7, the interconnect substrate INT is prepared. A solder layer SOL is formed, with small thickness, on the connection terminal TER of the interconnect substrate INT. Next, the Cu pillar PIL of the semiconductor chip SC is caused to face the connection terminal TER of the interconnect substrate INT, and the semiconductor chip SC is connected to the interconnect substrate INT in a flip-chip manner.

Meanwhile, after the semiconductor chip SC in a wafer state is connected to the interconnect substrate INT in a flip-chip manner, the semiconductor chip SC and the interconnect substrate INT may be cut out by dicing.

Next, the operations and effects of the embodiment will be described with reference to FIGS. 8A, 8B, 9, and 10. First, a case where the Ni layer NIL is formed on neither of the Cu pillar PIL and the connection terminal TER is considered. A current flows bi-directionally between the Cu pillar PIL and the connection terminal TER. For this reason, as the semiconductor device SD is used, a considerable amount of Cu diffuses from both the Cu pillar PIL and the connection terminal TER into the solder layer SOL. When the considerable amount of Cu diffuses into solder layer SOL, the diffused Cu combines with Sn within the solder layer SOL to form $Cu_3Sn$. The volume of $Cu_3Sn$ is smaller than the volume in a case where Sn is present alone. For this reason, when $Cu_3Sn$ is formed, a Kirkendall void is formed. In this case, there is a high possibility of the solder layer SOL being severed.

Figure 9:
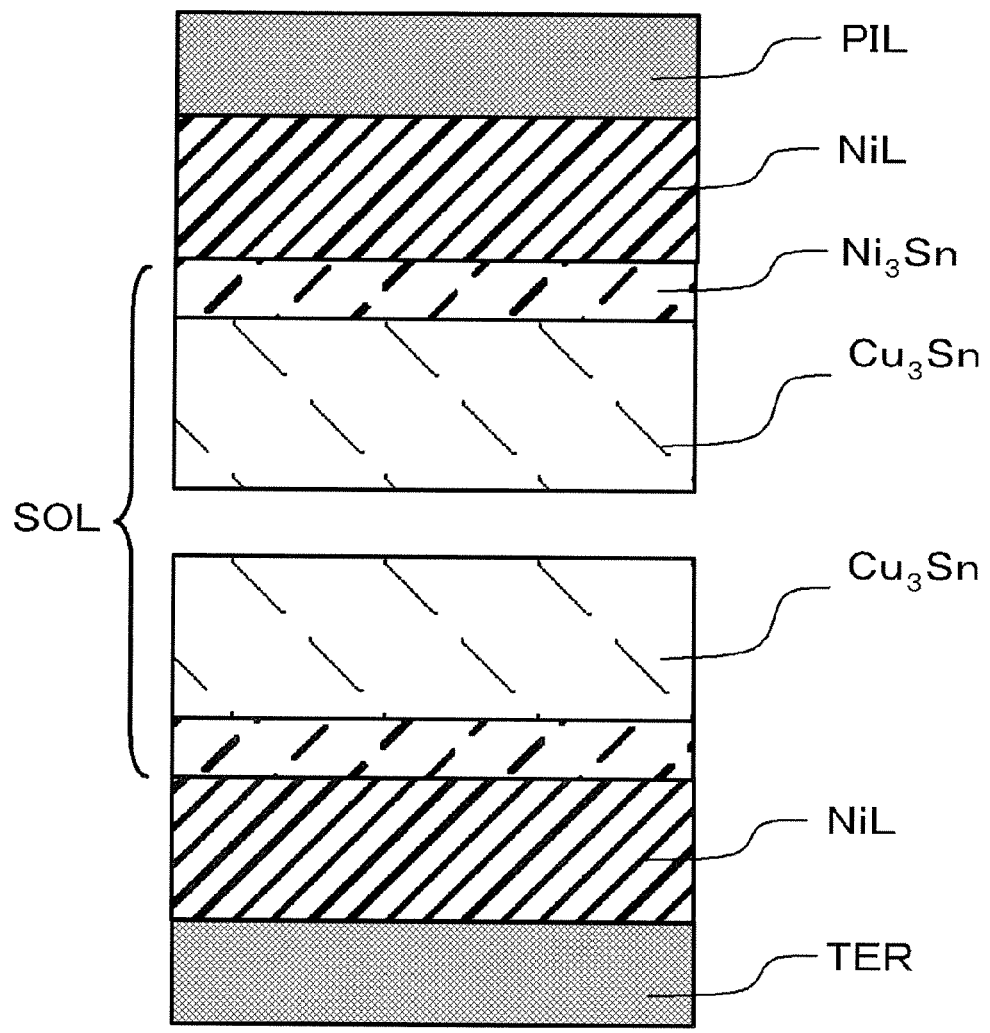
FIG. 9 is a diagram illustrating a continuation of FIG. 8B.

Next, referring to FIGS. 8A, 8B and 9, a case where the Ni layer NIL is formed on both the Cu pillar PIL and the connection terminal TER is considered. In this case, even when Cu diffuses from the Cu pillar PIL into the solder layer SOL, the Cu is blocked by the Ni layer NIL. In addition, even when Cu diffuses from the connection terminal TER into the solder layer SOL, the Cu is blocked by the Ni layer NIL. For this reason, insofar as the Ni layer NIL is present, an alloy of Cu and Sn is not formed within the solder layer SOL.

However, as shown in FIG. 8A, the alloying of Ni and Sn, that is, the formation of $Ni_3Sn$ proceeds from the interface between the Ni layer NIL and the solder layer SOL as the starting point. The entirety of the Ni layer NIL changes to $Ni_3Sn$ at a certain point in time. Then, this is in the same state as in a case where the Ni layer NIL is formed on neither of the Cu pillar PIL and the connection terminal TER, and thus as shown in FIG. 8B, the considerable amount of Cu diffuses from both the Cu pillar PIL and the connection terminal TER. For this reason, a Kirkendall void is formed due to the formation of $Cu_3Sn$, and thus there is a high possibility of the solder layer SOL being severed, as shown in FIG. 9.

In addition, as the semiconductor device SD is used, Sn within the solder layer SOL moves in a direction away from $Ni_3Sn$ due to electromigration. For this reason, a void caused by the electromigration of Sn may be formed in the interface between the unreacted portion of the solder layer SOL and $Ni_3Sn$. In this case, there is a possibility of the solder layer SOL being severed in this interface.

Figure 10A:
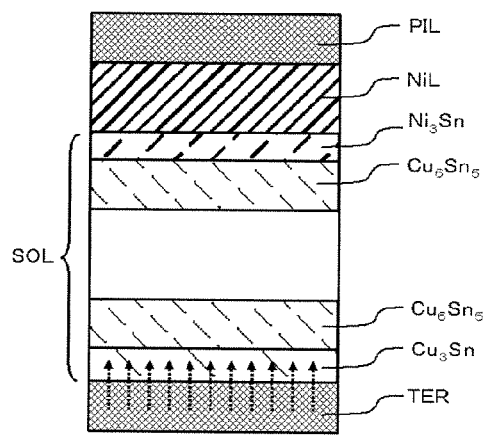
FIGS. 10A and 10B are diagrams illustrating an effect of the embodiment.
Figure 10B:
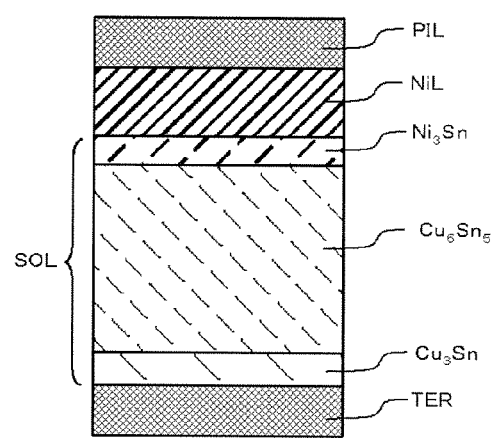

On the other hand, as shown in FIGS. 10A and 10B, in the embodiment, the Ni layer NIL is formed on either between the Cu pillar PIL and the connection terminal TER. For this reason, a $Ni_3Sn$ layer grows between the Ni layer NIL and the solder layer SOL, and simultaneous therewith, Cu diffuses out from an one, in which the Ni layer NIL is not formed, between the connection terminal TER and the Cu pillar PIL (in the example shown in the drawings, connection terminal TER), into the solder layer SOL. A portion of diffused Cu gathers at the interface between the solder layer SOL and the $Ni_3Sn$ layer, but the amount thereof is small. For this reason, a $Cu_6Sn_5$ layer is formed in the interface between the $Ni_3Sn$ layer and the solder layer SOL. Meanwhile, it is considered that Ni is contained in the $Cu_6Sn_5$ layer.

On the other hand, a $Cu_3Sn$ layer is formed in the interface between the solder layer SOL and an one, in which the Ni layer NIL is not formed, between the connection terminal TER and the Cu pillar PIL (in the example shown in the drawings, connection terminal TER). However, since Cu diffuses from only one of the connection terminal TER or the Cu pillar PIL into the solder layer SOL, Cu becomes short. For this reason, the $Cu_3Sn$ layer switches to the $Cu_6Sn_5$ layer at a certain timing. That is, after the $Cu_3Sn$ layer is first formed in the interface between the solder layer SOL and an one, in which the Ni layer NIL is not formed, between the connection terminal TER and the Cu pillar PIL (in the example shown in the drawings, connection terminal TER), the $Cu_6Sn_5$ layer is formed on the side of solder layer SOL.

Thereafter, as the semiconductor device SD is used, the $Cu_6Sn_5$ layer grows from both the Cu pillar PIL side and the connection terminal TER side into the solder layer SOL. The $Cu_6Sn_5$ layer has a smaller amount of Sn consumption than that of the $Cu_3Sn$ layer. In addition, the minimum value of the thickness of the solder layer SOL is equal to or less than 20 μm. For this reason, as shown in FIG. 10B, at least a portion of the Cu pillar PIL and at least a portion of the connection terminal TER are connected to each other, through an alloy layer in which the $Cu_3Sn$ layer, the $Cu_6Sn_5$ layer, and the $Ni_3Sn$ layer are laminated, and the Ni layer NIL. This alloy layer is thermally and electrically stable under the conditions in which the semiconductor device SD is used. For this reason, the connection structure of the Cu pillar PIL and the connection terminal TER becomes stable after the connection by the alloy layer and the Ni layer NIL, and thus there is a low possibility of disconnection. This effect becomes conspicuous as the minimum value of the thickness of the solder layer SOL gets smaller (for example, equal to or less than 15 μm, and further equal to or less than 12 μm).

Figure 18:
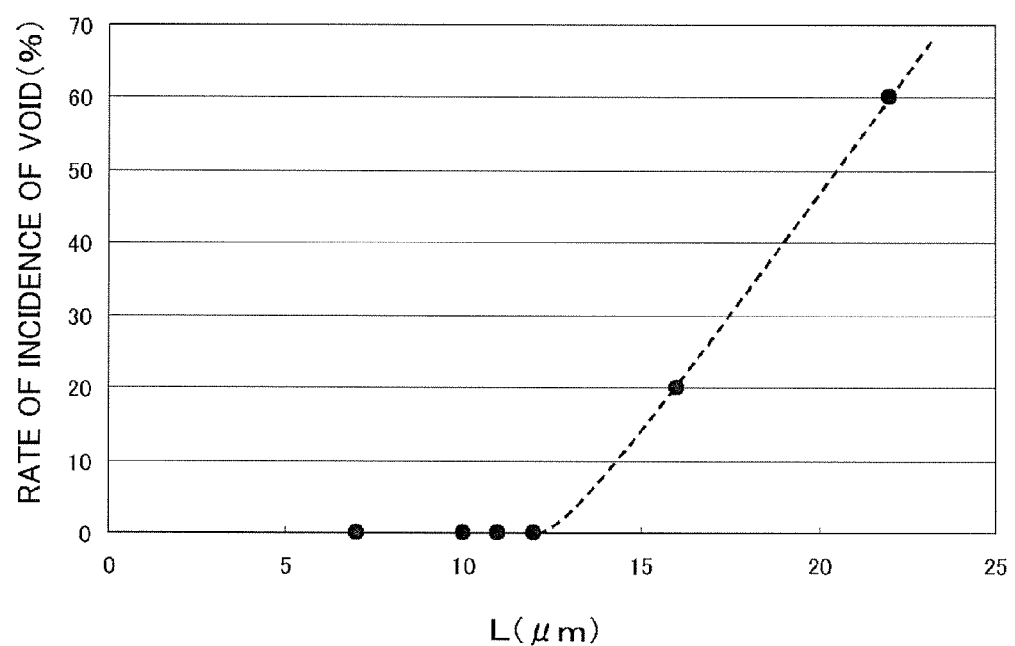
FIG. 18 is a graph illustrating a relationship between the thickness L of the solder layer and the rate of incidence of a void.

FIG. 18 is a graph illustrating a relationship between the thickness L of the solder layer SOL and the rate of incidence of a void. In this graph, the test conditions were set to a temperature of 175° C., an amount of current flowing of 200 mA, and a current flow time of 2,000 hours. When the thickness of the solder layer SOL was 7 μm, 10 μm, 11 μm, and 12 μm, any samples in which a void occurred were not present (0%). On the other hand, when the thickness of the solder layer SOL was 16 μm, a void occurred in 20% of the samples, and when the thickness of the solder layer SOL was 22 μm, a void occurred in 60% of the samples. From this, it is known that the thickness of the solder layer SOL is equal to or less than 20 μm, preferably equal to or less than 15 μm, and more preferably equal to or less than 12 μm.

Figure 11:
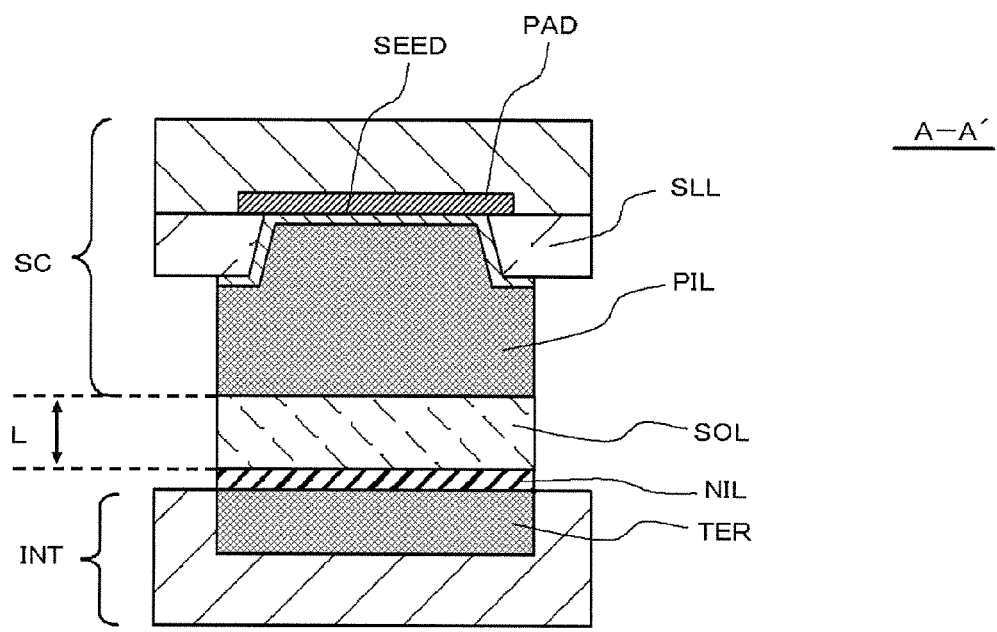
FIG. 11 is a cross-sectional view illustrating a modified example of FIG. 4.

Meanwhile, in the embodiment, as shown in FIG. 11, the Ni layer NIL may be formed on the connection terminal TER rather than on the Cu pillar PIL. In this case, the above-mentioned effect can also be obtained.

Figure 17:
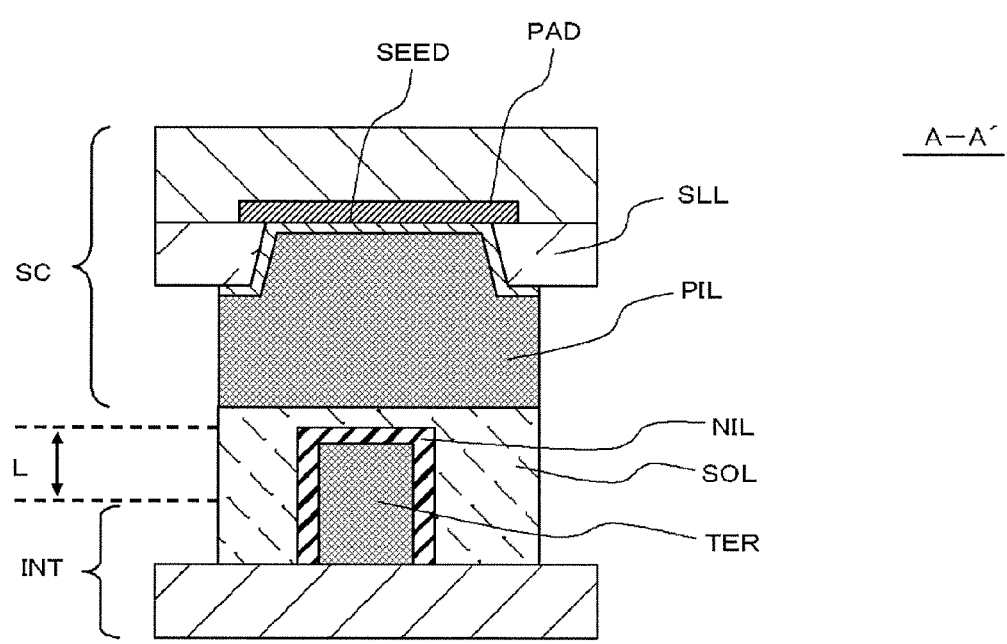
FIG. 17 is a cross-sectional view illustrating a modified example of FIG. 11.

Meanwhile, as shown in FIG. 17, the connection terminal TER may protrude from an uppermost resin layer of the interconnect substrate INT. Therefore, it is possible to further reduce the thickness of the thinnest portion of the solder layer SOL. Meanwhile, in this case, the Ni layer NIL is formed on the upper surface and the lateral side of the connection terminal TER.

Second Embodiment

Figure 12:
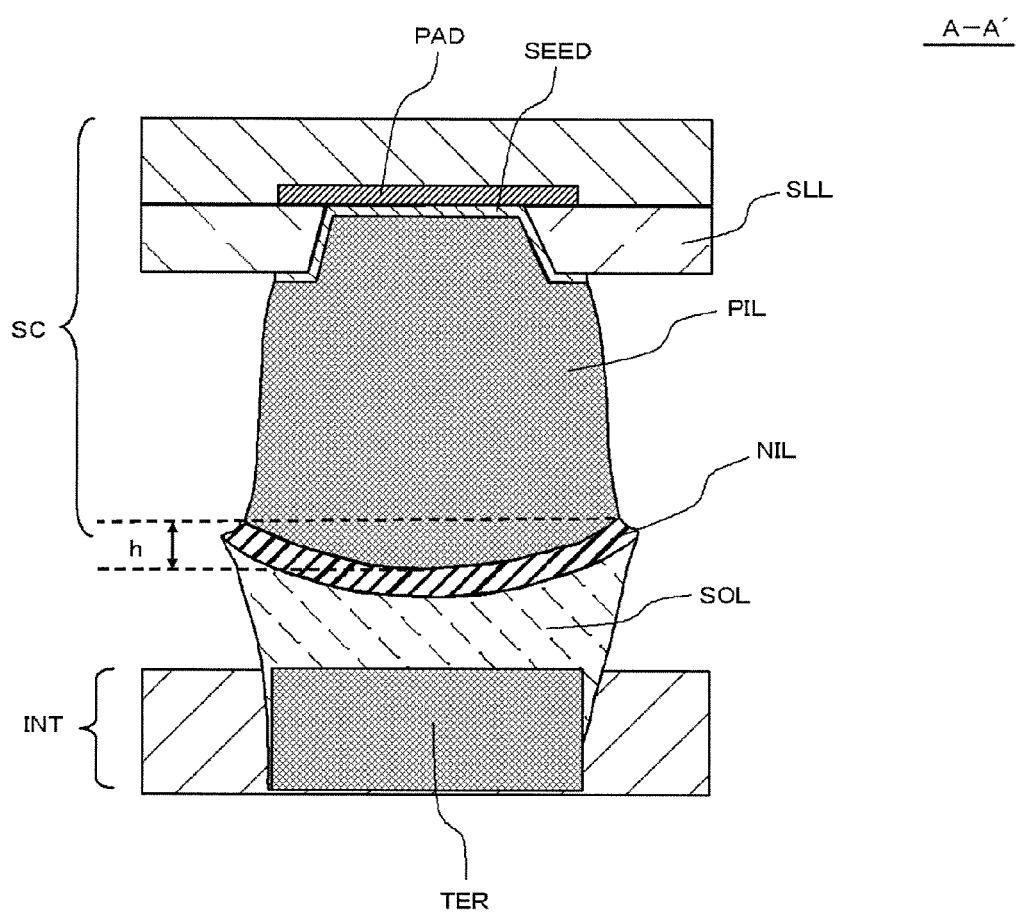
FIG. 12 is a cross-sectional view illustrating a connection structure of a semiconductor chip and an interconnect substrate in a semiconductor device according to a second embodiment.

FIG. 12 is a cross-sectional view illustrating a connection structure of the semiconductor chip SC and the interconnect substrate INT in the semiconductor device SD according to a second embodiment. The semiconductor device SD according to the embodiment has the same configuration as the semiconductor device SD according to the first embodiment, except for the shape of the Cu pillar PIL of the semiconductor chip SC.

First, the upper surface of the Cu pillar PIL is formed in a convex shape. The height of the convex shape, that is, the difference in elevation of the upper surface (surface on which the Ni layer NIL is formed) is equal to or more than 5 μm and equal to or less than 10 μm.

In addition, the cross-sectional area in the surface parallel to the electrode pad PAD of the Cu pillar PIL increases with increasing distance from the electrode pad PAD.

The shape of the Cu pillar PIL mentioned above can be realized by changing the shape of the opening of the resist film RES shown in FIGS. 5 to 7 in the first embodiment. Specifically, the cross-sectional area of the opening of the resist film RES in the surface parallel to the electrode pad PAD of the Cu pillar PIL is increased with increasing distance from the electrode pad PAD.

In addition, at least the upper portion of the lateral side of the connection terminal TER is connected to the solder layer SOL.

Figure 13:
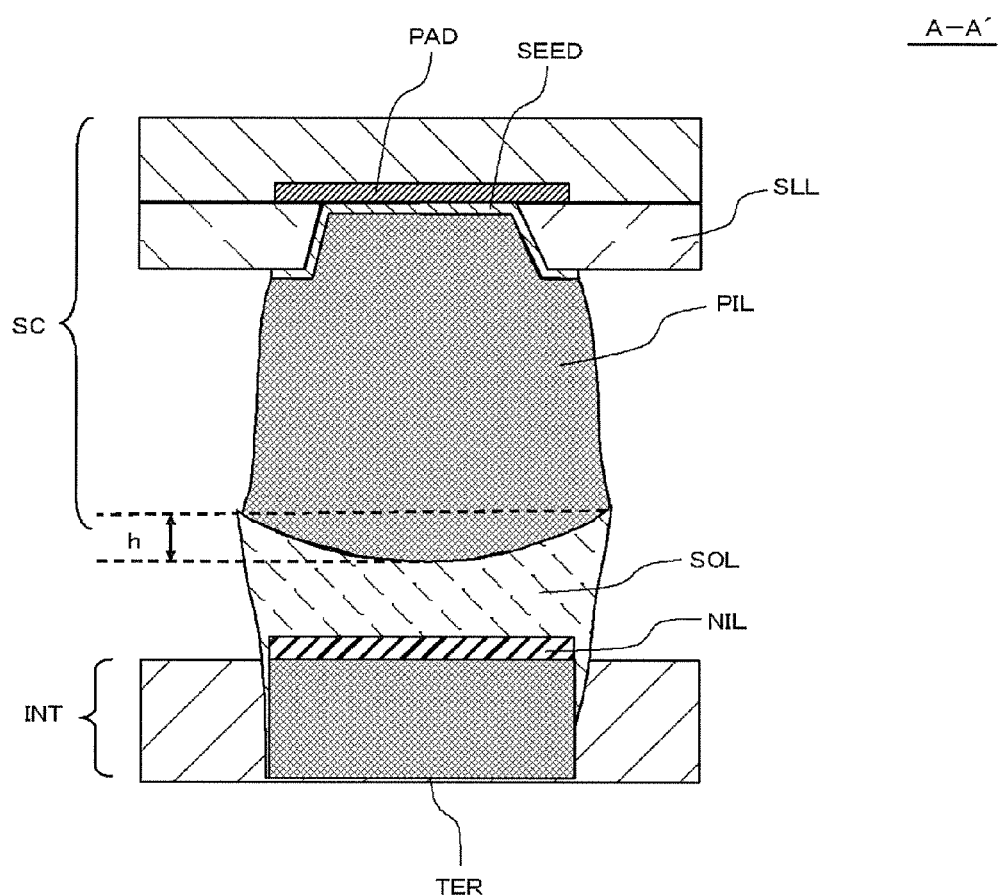
FIG. 13 is a cross-sectional view illustrating a modified example of FIG. 12.

Meanwhile, in the example shown in FIG. 12, the Ni layer NIL is formed on the Cu pillar PIL. However, as shown in FIG. 13, the Ni layer NIL may be formed on the connection terminal TER.

Figure 16:
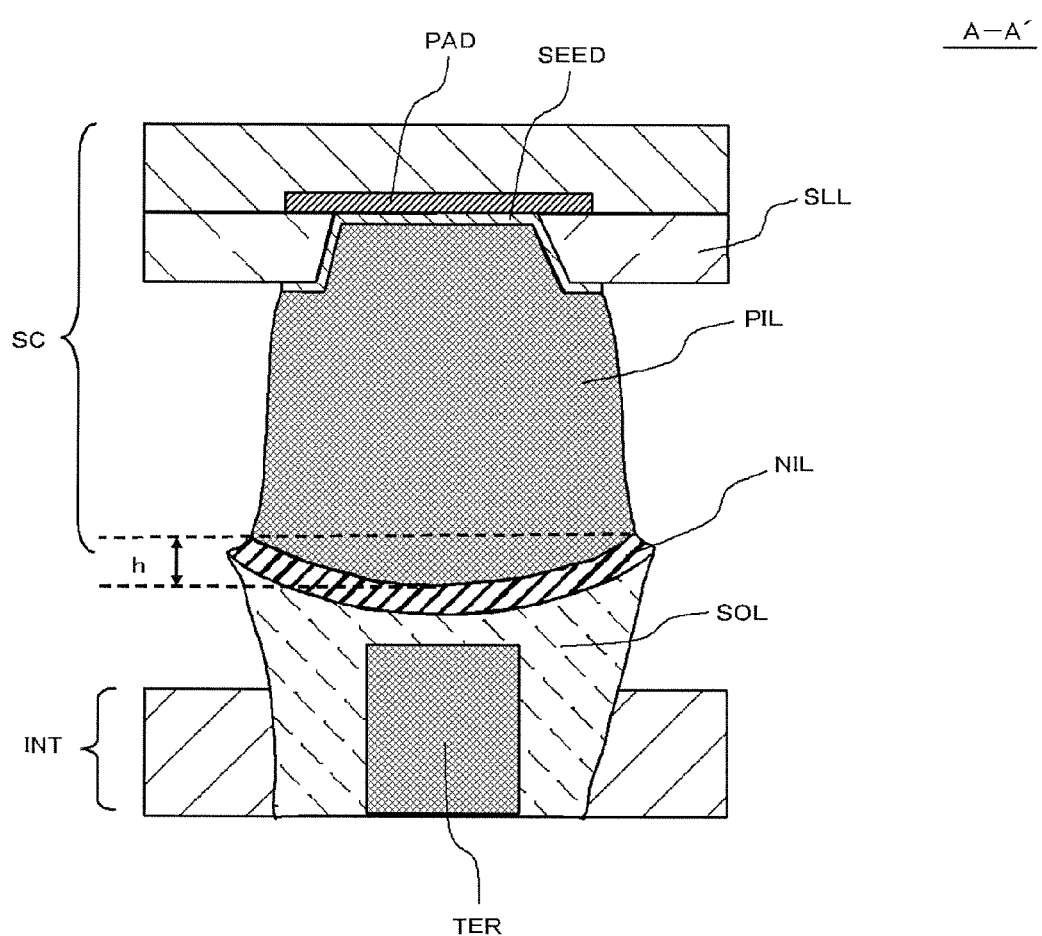
FIG. 16 is a cross-sectional view illustrating a modified example of FIG. 12.

In addition, as shown in FIG. 16, the connection terminal TER may protrude from the uppermost resin layer of the interconnect substrate INT. Therefore, it is possible to further reduce the thickness of the thinnest portion of the solder layer SOL. Meanwhile, in this case, the Ni layer NIL is formed on the upper surface and the lateral side of the connection terminal TER.

In the embodiment, the same effect as that of the first embodiment can also be obtained. In addition, the upper surface of the Cu pillar PIL is formed in a convex shape. For this reason, the minimum value of the thickness of the solder layer SOL is easily made smaller.

Figure 14:
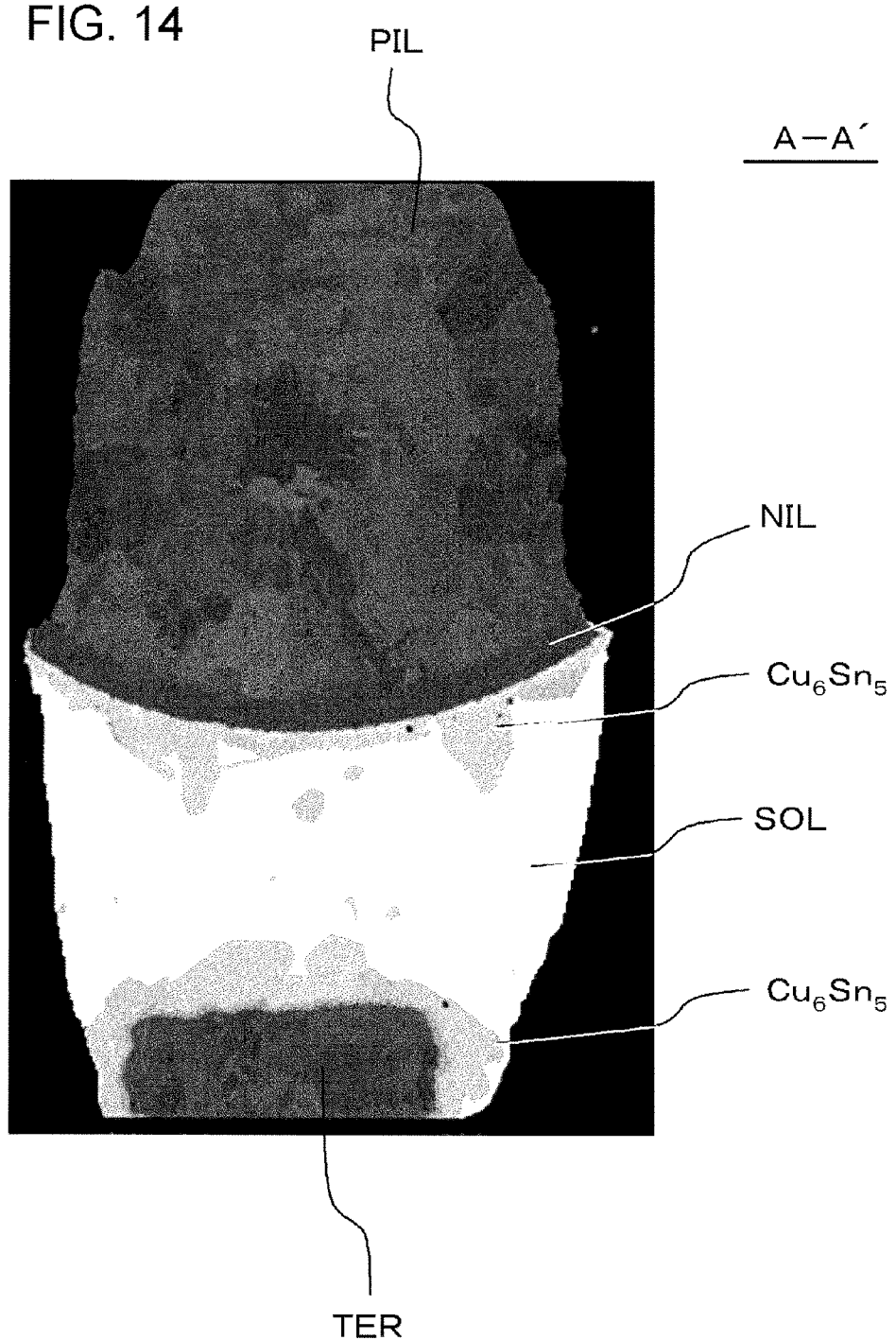
FIG. 14 is a cross-sectional photograph illustrating a state immediately after the Cu pillar and the connection terminal are connected to each other through the solder layer.
Figure 15:
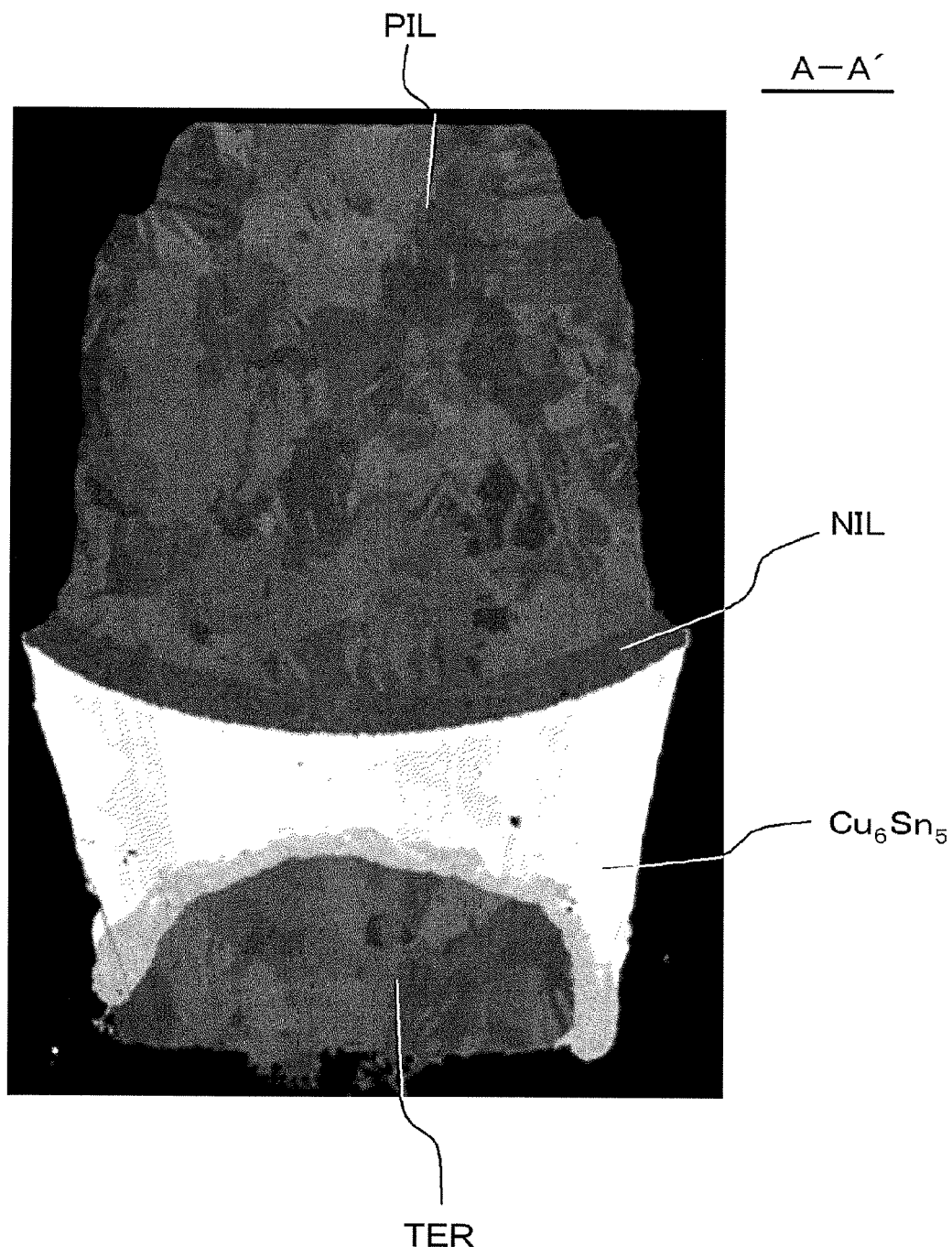
FIG. 15 is a cross-sectional photograph illustrating a state after electrification between the Cu pillar and the connection terminal for a predetermined time.

FIGS. 14 and 15 are cross-sectional photographs of a sample having a structure shown in FIG. 12. FIG. 14 shows a state immediately after the Cu pillar PIL and the connection terminal TER are connected to each other through the solder layer SOL. The solder layer SOL includes the $Cu_6Sn_5$ layer in each of the interface of the Cu pillar PIL side and the interface of the connection terminal TER side. This is considered to be formed in a process of performing reflow on the solder layer SOL.

FIG. 15 shows a state after electrification between the Cu pillar PIL and the connection terminal TER for a predetermined time. In the example shown in the drawing, the $Cu_6Sn_5$ layer grows, and connects the Ni layer NIL and the connection terminal TER. In this state, the solder layer SOL is not severed.

Meanwhile, as shown in FIG. 16, the upper end of the connection terminal TER may protrude from the surface of the interconnect substrate INT. Therefore, it is possible to further reduce the thickness of the thinnest portion of the solder layer SOL.

As mentioned above, although the invention implemented by the inventor has been specifically described on the basis of the embodiments, it goes without saying that the invention is not limited to the above embodiments, but various changes and modifications can be made without departing from the spirit and scope of the invention.

What is claimed is:

1. A semiconductor device comprising:
a semiconductor chip; and
an interconnect substrate over which the semiconductor chip is mounted in a flip-chip,
wherein the semiconductor chip includes
an electrode pad, and
a Cu pillar formed over the electrode pad,
the interconnect substrate includes a connection terminal made of a metal containing Cu,
the Cu pillar and the connection terminal are connected to each other through a solder layer containing Sn,
a Ni layer is formed in one of an interface between the Cu pillar and the solder layer and an interface between the solder layer and the connection terminal, and is not formed on another interface, and
a thickness of a most thinnest part of the solder layer is equal to or less than 20 μm and equal to or more than 5 μm.

2. The semiconductor device according to claim 1, wherein the solder layer includes an alloy layer of Cu and Sn, and at least a portion of the Cu pillar and at least a portion of the connection terminal are connected to each other through the alloy layer.

3. The semiconductor device according to claim 1, wherein the solder layer includes an alloy layer of Cu and Sn, and the alloy layer grows as a current is caused to flow between the electrode pad and the connection terminal, so that at least a portion of the Cu pillar and at least a portion of the connection terminal are connected to each other through the alloy layer.

4. The semiconductor device according to claim 2, wherein the alloy layer includes a $Cu_6Sn_5$ layer.

5. The semiconductor device according to claim 4, wherein the alloy layer includes a $Ni_3Sn$ layer in an interface with the Ni layer, and includes a $Cu_3Sn$ layer in another interface.

6. The semiconductor device according to claim 1, wherein a minimum value of a thickness of the solder layer is equal to or less than 15 μm.

7. The semiconductor device according to claim 1, wherein a minimum value of a thickness of the solder layer is equal to or less than 12 μm.

* * * * *